United States Patent
Turner et al.

(10) Patent No.: US 8,471,720 B2
(45) Date of Patent: Jun. 25, 2013

(54) ON-CHIP POWER SUPPLY MONITORING USING A NETWORK OF MODULATORS

(75) Inventors: Mark Franklin Turner, Longmont, CO (US); Jeffrey S. Brown, Fort Collins, CO (US); Jonathan W. Byrn, Fort Collins, CO (US)

(73) Assignee: LSI Corporation, San Jose, CA (US)

( * ) Notice: Subject to any disclaimer, the term of this patent is extended or adjusted under 35 U.S.C. 154(b) by 380 days.

(21) Appl. No.: 12/947,890

(22) Filed: Nov. 17, 2010

(65) Prior Publication Data

US 2012/0119788 A1    May 17, 2012

(51) Int. Cl.
*G08B 21/00* (2006.01)

(52) U.S. Cl.
USPC .................. 340/661; 340/438; 340/425.5

(58) Field of Classification Search
USPC ....... 340/641–642, 635, 438, 425.5, 660–664
See application file for complete search history.

(56) References Cited

U.S. PATENT DOCUMENTS

| | | | | |
|---|---|---|---|---|
| 6,417,792 B1 * | 7/2002 | King et al. | | 341/143 |
| 7,250,812 B2 * | 7/2007 | Frech et al. | | 327/541 |
| 7,348,836 B1 * | 3/2008 | Velmurugan | | 327/545 |
| 7,605,601 B2 * | 10/2009 | Tachibana et al. | | 326/21 |
| 2004/0057324 A1 * | 3/2004 | Abe et al. | | 365/232 |
| 2008/0191747 A1 * | 8/2008 | Konmoto | | 327/63 |
| 2009/0063081 A1 * | 3/2009 | Xu | | 702/107 |

OTHER PUBLICATIONS

Yasuhiro Ogasahara et al., "All-Digital Ring-Oscillator-Based Macro for Sensing Dynamic Supply Noise Waveform," IEEE Journal of Solid-State Circuits, vol. 44, No. 6, Jun. 2009, pp. 1745-1755.

* cited by examiner

*Primary Examiner* — Daniel Previl
(74) *Attorney, Agent, or Firm* — Otterstedt, Ellenbogen & Kammer, LLP (57) ABSTRACT

An apparatus for monitoring at least supply voltage in an IC includes a plurality of monitor circuits distributed throughout the integrated circuit. Each of the monitor circuits is operative to receive the supply voltage, or a signal representative thereof, and to generate an output signal indicative of a comparison between the supply voltage and a reference voltage. The apparatus further includes a control circuit coupled to the plurality of monitor circuits. The control circuit is operative to receive the respective output signals from the plurality of monitor circuits and to generate an output of the apparatus which is a function of information conveyed in the respective output signals from the plurality of monitor circuits.

25 Claims, 3 Drawing Sheets

ON-CHIP POWER SUPPLY MONITORING USING A NETWORK OF MODULATORS

FIELD OF THE INVENTION

The present invention relates generally to the electrical, electronic, and computer arts, and more particularly relates to power supply monitoring in an integrated circuit (IC).

BACKGROUND OF THE INVENTION

In today's technologies, it is critical to monitor power supply conditions (e.g., voltage level variations and/or noise) in a system due primarily to the negative impact of such conditions on performance and integrity of the system. These conditions, however, are often difficult to estimate accurately during a design phase due at least in part to their strong dependence on various parasitic elements, both on-chip and off-chip, as well as process dependence of local switching activity.

Supply noise has become a serious problem in recent IC designs. This problem is exacerbated with the use of lower power supply voltage levels (e.g., 1.2 volts or less) and increased current consumption, among other factors. Many digital power supplies are noisy enough to make high-speed interfaces and other circuitry, including, for example, double data rate (DDR) and serializer/deserializer (Serdes) circuitry, fail. Decoupling capacitance mitigates dynamic power supply fluctuations. However, such decoupling capacitance significantly increases the amount of chip area required by an IC design and is therefore undesirable (or impractical). Furthermore, excessive decoupling capacitance, typically implemented in an IC using metal-oxide-semiconductor (MOS) transistors, results in severe gate leakage in advanced IC fabrication technologies. Although the use of adequate power supply wiring may help reduce power supply noise, wiring resources are often limited and excessive amounts of power supply wiring makes signal routing difficult, particularly for dense IC designs.

Power consumption in high-end ICs and systems-on-chip (SoC) designs has been roughly doubling every two years, and this problem is expanding as on-chip functionality increases. The current generation of intellectual property (IP) cores—many of which are based on outdated architectures—were never designed with low-power requirements in mind. By addressing power usage at an early architectural stage, block-level power consumption can be substantially reduced compared to traditional designs. However, while computer-aided design (CAD) tools are available to analyze a power supply network in an IC (e.g., VoltageStorm®, a registered trademark of Cadence Design Systems, Inc., and PowerTheater™ and CoolTime™, trademarks of Sequence Design Inc.), obtaining accurate on-chip data in order to correlate the CAD tools with actual design implementations and to debug issues as they arise remains a challenge.

SUMMARY OF THE INVENTION

Principles of the invention, in illustrative embodiments thereof, advantageously provide a power supply monitoring network for an IC comprised of a plurality of local on-chip monitors distributed throughout the IC design. Each of the monitors is preferably substantially small so as not to consume significant chip area. Aspects of the invention employ decimation techniques to increase the accuracy of the power supply monitoring network. By decimating across multiple delta-sigma modulators, operative as local power supply monitors, noise and other random variations to which the monitors may be subjected can be advantageously reduced or even eliminated. In this manner, the sampling rate and resolution of each of the individual monitors can be beneficially relaxed.

In accordance with one aspect of the invention, an apparatus for monitoring at least supply voltage in an IC includes a plurality of monitor circuits distributed throughout the integrated circuit. Each of the monitor circuits is operative to receive the supply voltage, or a signal representative thereof, and to generate an output signal indicative of a comparison between the supply voltage and a reference voltage. The apparatus further includes a control circuit coupled to the plurality of monitor circuits. The control circuit is operative to receive the respective output signals from the plurality of monitor circuits and to generate an output of the apparatus which is a function of information conveyed in the respective output signals from the plurality of monitor circuits.

In accordance with another aspect of the invention, an IC is provided including at least one power supply monitoring network for monitoring a supply voltage of the IC. The power supply monitoring network includes a plurality of monitor circuits distributed throughout the IC, each of the monitor circuits being operative to receive the supply voltage or a signal representative thereof and to generate at least one output signal indicative of a comparison between the supply voltage and a reference voltage. The power supply monitoring network further includes a control circuit coupled to the plurality of monitor circuits. The control circuit is operative to receive the respective output signals from the plurality of monitor circuits and to generate an output of the power supply monitoring network which is a function of information conveyed in the respective output signals from the plurality of monitor circuits.

In accordance with yet another aspect of the invention, a method is provided for monitoring at least supply voltage in an integrated circuit including a plurality of monitor circuits distributed throughout the integrated circuit and a control circuit coupled to the plurality of monitor circuits. The method includes the steps of: each of the monitor circuits receiving the supply voltage or a signal representative thereof and generating at least one output signal indicative of a comparison between the supply voltage and a reference voltage; and the control circuit receiving the respective output signals from the monitor circuits and generating an output which is a function of information conveyed in the respective output signals from the monitor circuits.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF THE INVENTION

The present invention will be described herein in the context of a distributed network of delta-sigma modulators (DSMs) configured to collectively function as a power supply monitor circuit in an IC. It should be understood, however, that the present invention is not limited to these or any particular power supply monitor circuit arrangements. Rather, the invention is more generally suitable for use in any circuit application in which it is desirable to provide improved performance, at least in terms of monitoring the power supply in an IC. Techniques of the present invention beneficially provide accurate power supply monitoring without significantly increasing power consumption in the IC and without significantly impacting chip area or performance.

Embodiments of the present invention thus offer significant advantages over conventional power supply monitoring methodologies. Moreover, it will become apparent to those skilled in the art given the teachings herein that numerous modifications can be made to the embodiments shown that are within the scope of the present invention. That is, no limitations with respect to the specific embodiments shown and described herein are intended or should be inferred.

Although reference may be made herein to n-channel metal-oxide-semiconductor (NMOS) or p-channel metal-oxide-semiconductor (PMOS) transistor devices which may be formed using a complementary metal-oxide-semiconductor (CMOS) IC fabrication process, the invention is not limited to such devices and/or such an IC fabrication process. Furthermore, although preferred embodiments of the invention may be fabricated in a silicon wafer, embodiments of the invention can alternatively be fabricated in wafers comprising other materials, including but not limited to gallium arsenide (GaAs), indium phosphide (InP), etc.

As previously stated, it is desirable to monitor power supply conditions in a system, including voltage level fluctuations and/or noise, due primarily to the close influence of such conditions on system performance and integrity. These conditions, however, are often difficult to estimate accurately during a design phase due at least in part to their strong dependence on various parasitic elements, both on-chip and off-chip, as well as process dependence of local switching activity. As power supply voltage and transistor threshold voltage are scaled down and clock speeds are scaled up, particularly in nanometer technology, power supply noise margin will continue to decrease. Consequently, modeling and control of power supply noise in an IC design is critical in determining circuit performance and reliability.

Power supply noise can be simulated by modeling the resistance, inductance and capacitance of a power distribution network in an IC design. However, while CAD tools are commercially available to model a power supply network in an IC, obtaining accurate on-chip data for correlating the CAD tools with actual (i.e., measured) circuit behavior and for debugging performance issues as they arise during normal operation of the IC has remained, thus far, a challenge.

Ideally, it would be desirable to utilize several (e.g., hundreds or more) analog monitor circuits distributed throughout the chip (e.g., around digital logic circuitry in the IC), each monitor circuit being operative to provide local power supply voltage information. However, in order to provide power supply information of any appreciable accuracy, the required complexity and corresponding chip area would render the use of such monitor circuits impractical.

According to aspects of the invention, IC monitoring is achieved through the use of a distributed network of substantially small, localized monitor circuits so as to minimize power consumption and chip area in the IC. Preferably, each of the plurality of monitor circuits is adaptable for use with standard-cell layout methodologies; ideally, the respective monitor circuits can be placed using gate-array backfill cells, which would facilitate implementation with modern IC fabrication technologies (e.g., 28 nanometers (nm)). This technique inserts gate-array cells in substantially all of the space on an IC die that is unoccupied by active circuitry. In this manner, monitor circuits can be placed more densely in areas of the IC expected to be noisy (e.g., digital logic) or otherwise more sensitive to power supply noise and/or voltage level fluctuations (e.g., analog voltage reference generation and sensing circuitry). In accordance with aspects of the invention, the on-chip monitor circuits are utilized functionally with feedback control circuitry to control one or more parameters of the IC which affect the power supply (e.g., noise and voltage level), including, but not limited to, clock frequency and timing, data flow, power supply voltage levels, etc.

In order to reduce the amount of area consumed, the monitor circuits preferably comprise digital-sized transistors, according to embodiments of the invention. Each of the monitors is preferably of low-resolution, such as, for example, sixteen levels within a 100 or 200 millivolt (mV) range. At this relatively low level of resolution, the monitor circuits are preferably able to resolve voltage level measurements quickly so as to provide a high data sampling rate, such as, for example, about two giga-samples per second (gs/sec) or faster. A circuit which is well-suited for resolving information at a high sample rate is a delta-sigma analog-to-digital converter (ADC), also referred to herein as a delta-sigma modulator (DSM).

In accordance with an embodiment of the invention, each of at least a subset of the monitor circuits in the IC power supply monitoring network comprises a delta-sigma modulator. In order to increase the overall accuracy of the monitoring network, aspects of the invention advantageously employ decimation techniques, as will be described in further detail below. By decimating across multiple delta-sigma modulators, operative as local power supply monitors, noise and other random variations to which the monitors may be subjected can be reduced or even eliminated. In this manner, the resolution requirements of each of the individual monitor circuits can be beneficially relaxed without significantly degrading overall accuracy of the power supply monitoring network.

Figure 1:
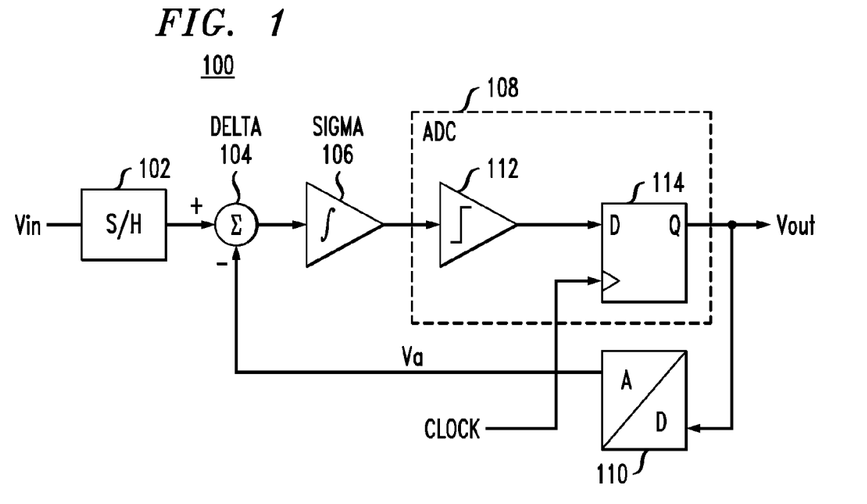
FIG. 1 is a block diagram depicting an exemplary first order delta-sigma modulator which can be employed for implementing techniques of the present invention.

FIG. 1 is a block diagram depicting at least a portion of an exemplary first order delta-sigma modulator (DSM) 100 which can be employed for implementing techniques of the present invention. DSM 100 includes a sample-and-hold (S/H) block 102 adapted for receiving an analog input signal, Vin, supplied thereto, a summer 104 coupled to an output of the S/H, an integrator 106 coupled to the summer, an analog-to-digital converter (ADC) 108 adapted to receive, as an input, an output signal from the integrator and to generate a digital output stream, Vout, indicative of the integrator output signal, and a digital-to-analog converter (DAC) 110 adapted to receive, as an input, the digital output stream from the ADC and to generate an analog output signal, Va, which is supplied to the summer in a closed loop feedback configuration. The ADC 108 may include a comparator 112, operative to generate an output signal which is indicative of a difference between two or more input signals supplied thereto, and a latch 114, which may be implemented, for example, as a D-type flip-flop, for at least temporarily storing the comparison result until a subsequent sample period.

Although the DSM 100 is shown as being comprised of discrete functional blocks (e.g., S/H block 102, summer (delta) 104, integrator (sigma) 106, comparator 112, latch 114 and DAC 110) in FIG. 1, it is to be appreciated that one or more of these functional blocks may be combined, either together or with other functional blocks (not explicitly shown), to form one or more other functional blocks which incorporate the functions of the combined blocks. For example, comparator 112 and latch 114 may be implemented by a latching comparator which is operative to perform the functions of both blocks. Likewise, a single operational amplifier (op-amp) can function as an integrator and its switched-capacitor input may function as the summer and S/H circuit.

A delta-sigma converter utilizes many samples from the modulator to generate a stream of one-bit digital codes. To accomplish this, the delta-sigma ADC uses an input signal quantizer operating at a relatively high sample rate. The DSM, like all quantizers, is adapted to receive an input signal and to generate a stream of digital values indicative of a voltage level of the input signal.

In terms of operation in the time domain, the DSM measures a difference (e.g., summer/delta 104) between the analog input signal (Vin) and the analog output (Va) of the feedback DAC 110. The integrator (sigma) 106 then measures the analog voltage output of the summing junction and presents a sloping signal to the one-bit ADC 108. The ADC 108 is operative to convert the integrator output signal to a digital one or zero, relative to the prescribed reference voltage Vref. Using the clock signal CLOCK, the ADC supplies to one-bit digital output stream Vout to the DSM output as well as back through the feedback loop comprised of one-bit DAC 110. The one-bit ADC 108 digitizes the input signal to a coarse output code having a quantization noise, $e_i$, of the converter. The DSM output, $y_i$, is equal to the input, $x_{i-1}$, plus the quantization noise, $(e_i-e_{i-1})$, such that $y_i=x_{i-1}+(e_i-e_{i-1})$. As the expression indicates, quantization noise is the difference between the error of a current input sample and the error of a previous input sample. The time-domain output signal Vout is a pulse-wave representation of the input signal Vin at a sampling frequency, $f_s$, of the clock signal CLOCK.

In the frequency domain, the time-domain output pulses appear as the original input signal and shaped noise. The shaped noise appearing in the frequency domain representation of the DSM output is primarily a function of the integrator 106. The DSM tends to push quantization noise to a higher portion of the frequency spectrum, thereby facilitating the production of a higher resolution result. Low-frequency quantization noise can be minimized by adding a second integrator, as in the case of a second-order DSM. However, while the invention contemplates using a second-order DSM in one or more of the modulator circuits in the IC power supply monitoring network, use of a second-order DSM would add to the complexity of the overall monitoring network and would also increase the required chip area.

Figure 2:
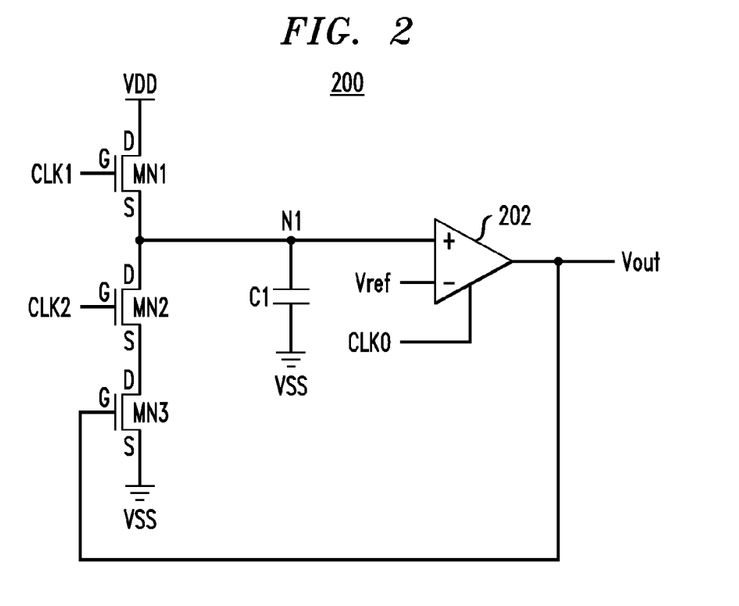
FIG. 2 is a schematic diagram depicting at least a portion of an exemplary first order delta-sigma modulator, according to an embodiment of the present invention.

With reference now to FIG. 2, a schematic diagram illustrates at least a portion of an exemplary first-order DSM 200, according to an embodiment of the invention. DSM 200 may be used for implementing one or more of the plurality of monitor circuits in the IC power supply monitoring network. DSM 200 includes a first NMOS transistor MN1 and a second NMOS transistor MN2 connected together in series. Specifically, a drain (D) of transistor MN1 is adapted for connection to a voltage supply of the DSM 200, which may be VDD, a gate (G) of MN1 is adapted to receive a first control signal, which may be a first clock signal CLK1, a source (S) of MN1 is connected to a drain of transistor MN2 at a first node N1, a gate of MN2 is adapted to receive a second control signal, which may be a second clock signal CLK2, and a source of MN2 is adapted for connection to a voltage return of the DSM, which may be VSS or ground, via a third NMOS transistor MN3. More particularly, a drain of transistor MN3 is connected to the source of MN2 and a source of MN3 is connected to VSS. A gate of transistor MN3 is adapted to receive a third control signal, which may be a digital output stream, Vout, of the DSM 200.

Although NMOS transistors are used in the DSM 200 shown in FIG. 2, it is to be understood that the invention is not limited to these devices; rather, alternative switching devices can be similarly employed, including, for example, PMOS transistors, bipolar junction transistors (BJTs), pass gates, etc., with or without modification to the circuit. Furthermore, it is to be appreciated that, because an MOS device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

DSM 200 further comprises a sense amplifier/comparator 202, which may be implemented using a differential op-amp or alternative comparison circuitry. A first input of the sense amplifier 202, which may be a non-inverting (+) input, is connected to node N1 and a second input of the sense amplifier, which may be an inverting (−) input, is adapted to receive a reference voltage, Vref, supplied thereto. The reference voltage Vref may be generated (either directly or scaled therefrom) by a substantially stable and preferably temperature-independent voltage source, such as, for example, a bandgap voltage reference, included in DSM 200 or supplied externally to the DSM 200. In some IC designs, a bandgap voltage reference source is readily available, and thus an additional voltage reference source would not be required.

Sense amplifier 202 is preferably a latching sense amplifier which includes a control input for receiving a fourth control signal, which may be a third clock signal, CLK0. An output signal, Vout, generated by sense amplifier 202 is indicative of a difference between the voltage at node N1 and the reference voltage Vref supplied to the sense amplifier. A voltage level of the resulting comparison output Vout is stored (e.g., latched) as a function of the control signal CLK0 supplied to the sense amplifier 202. The latching sense amplifier 202 functions essentially as a one-bit ADC (e.g., ADC 108 in FIG. 1). In this regard, the one-bit ADC functionality in DSM 200 is implemented in a manner similar to a latching sense amplifier included, for example, in a static random access memory (SRAM).

According to embodiments of the invention, the respective clock signals CLK0, CLK1 and CLK2 may be unrelated to one another, or alternatively each of the clock signals may be generated (e.g., using counters, etc.) as prescribed ratios of a common reference clock (e.g., divided down or scaled up in frequency by a predefined value), using either a same or different phase of the common clock. Different phases and/or divisions of a common clock signal (e.g., phase-locked loop (PLL)) are often widely available in a given IC design. Techniques for generating prescribed ratios and/or phases of a clock signal will be known by those skilled in the art and will therefore not be discussed in further detail herein. Further discussion of possible implementations of the clock signals CLK0, CLK1 and CLK2 is provided below in conjunction with a description of the latching sense amplifier/comparator.

DSM 200 includes a capacitor, C1, or an alternative capacitive element, having a first terminal connected to node N1 and having a second terminal adapted for connection to VSS, or an alternative voltage source. Capacitor C1 can be implemented, for example, using an MOS transistor or, alternatively, as a metal-polysilicon or metal-metal IC structure, as will be known by those skilled in the art. In order to reduce the amount of area required by the DSM, the value of capacitor C1 is preferably made relatively small, such as, for example, on the order to about 10 femtofarads (fF), although the invention is not limited to any specific capacitance value. Using smaller capacitance values for the sampling node N1 generally necessitates using higher sampling rates due to noise and transistor leakage (e.g., for a 10 fF capacitor, a sampling rate of about 1 gs/sec may be used).

Capacitor C1 in conjunction with transistors MN1 and MN2 essentially form a charge pump which, operating as a voltage/charge accumulator, performs an integration function. Additionally, capacitor C1, combined with parasitic capacitances on node N1, will at least temporarily store the voltage on node N1, which acts as a summing junction, thereby performing a sample-and-hold function. In this regard, node N1 may be referred to herein as a sampling node. Thus, in relation to the illustrative DSM 100 shown in FIG. 1, the functions of S/H block 102, summer 104 and integrator 106 are all implemented by transistors MN1 and MN2 and capacitor C1 in the DSM 200 of FIG. 2. Transistors MN1 and MN2 may be minimum-sized digital transistors in order to reduce the required area of the DSM 200.

The DAC functionality (e.g., DAC 110 in FIG. 1) in the illustrative DSM 200 is implemented in DSM 200 as an inverter, comprised of NMOS transistor MN3, driving back into the charge pump in a feedback configuration as a function of the output signal Vout generated by sense amplifier 202. Transistor MN3 essentially functions as a weak inverter (compared to a standard inverter employing a PMOS pull-up device), with switching transistor MN1 providing the pull-up resistance. In this manner, the arrangement for the DAC in DSM 200 is similar to the operation of a binary-quantized phase detector, also known as a "bang-bang" charge pump phase detector. Although the invention contemplates various other ways in which the DAC can be implemented, a DAC employing a single digital-sized transistor provides a highly compact DSM architecture and is therefore desirable.

In terms of operation of DSM 200, sense amplifier 202 will compare the reference voltage Vref with the voltage accumulated on sampling node N1 and generate the output signal Vout which is a stream of 1-bit codes indicative of the measured difference. More particularly, when the voltage on node N1 is less than the reference voltage Vref, the output signal Vout will be a logic low level (e.g., zero volts or VSS), and likewise when the voltage on node N1 is greater than Vref, Vout will be a logic high level (e.g., VDD). The sampling period (i.e., sampling cycle) during which sense amplifier 202 is operative to measure the difference between the voltages at its respective inputs and to generate the output signal Vout indicative thereof, will be a function of the control signal CLK0 supplied thereto. Specifically, when CLK0 is high (e.g., VDD), sense amplifier 202 will preferably be enabled to generate the output signal Vout as a function of the input signals supplied thereto, and when CLK0 is low, the comparator will be disabled and preferably simply maintain (i.e., latch) the state of the previous sample period. A sampling rate of the DSM 200 is therefore primarily a function of clock signal CLK0. Of course, the invention contemplates other means for realizing a comparison function, as will become apparent to those skilled in the art given the teachings herein.

With regard to configuration of the clock signals CLK0, CLK1 and CLK2 relative to one another, one consideration is that the output signal Vout generated by sense amplifier 202 preferably remains stable whenever CLK1 or CLK2 are asserted so as to allow consistent resolution of summing node N1. One simple implementation which achieves this objective is to have CLK1 and CLK2 be the same signal and CLK0 be its inversion, so that while MN1 and MN2 are actively conducting, the sense amplifier 202 is latched, and when the sense amplifier is resolving a new value, the summing node N1 is stable.

However, it is possible with this implementation in different process technologies (using an NMOS transistor to pull node N1 up towards VDD rather than a PMOS transistor for better matching) that the ratio of on-resistance between transistors MN1 and MN2 will be substantially different, in which case it might be preferable to give CLK1 a different "duty-cycle" (i.e., the percentage of time the clock signal is high (e.g., VDD) versus the percentage of time the clock signal is low (e.g., VSS)) than CLK2, which allows the pull-up and pull-down paths to have a more similar effective long-term resistance (so as to allow the output signal Vout to have a code which roughly comprises half "1's" and half "0's." Note, that since the pull-up path is not controlled by the feedback loop but is always active as a function of clock signal CLK1, the pull-down path should always be stronger than the pull-up path or else the circuit will not function properly; a factor of about two to four times stronger is sufficient.

The input voltage to be monitored by DSM 200, which in this instance is the supply voltage VDD, will be scaled by a simple switching pull-up circuit, implemented as a switched-capacitor divider running off clock signal CLK1 such that sampling node N1 is weakly pulled up to VDD each cycle through transistor MN1. The respective duty-cycles of clock signals CLK1 and CLK2 (i.e., the ratio of time they are at VDD versus VSS) and a ratio of channel width to channel length (W/L ratio) of each of transistors MN1, MN2 and MN3 are preferably set such that the scaled value of the desired supply voltage VDD is substantially equal to Vref. Node N1 will also be pulled down to VSS through transistor MN2, as a function of clock signal CLK2, and transistor MN3, as a function of digital signal Vout, thereby discharging node N1. The charging and discharging rates of node N1 will be a function of a resistance-capacitance (RC) time constant of node N1. Thus, the voltage appearing on node N1 will be effectively averaged by the capacitance on node N1. The accumulated voltage stored on node N1 by capacitor C1 will be compared to the reference voltage Vref by sense amplifier 202 (e.g., during a sample period controlled by clock signal CLK0) and, as a result of the feedback connection arrangement, the DSM 200 will try to maintain node N1 at substantially the same voltage as the reference input (i.e., Vref).

Specifically, assuming the voltage on sampling node N1 is initially at VSS (e.g., zero volts), the inverting input receiving voltage Vref (e.g., about 0.4 volts) will be greater than the non-inverting input receiving the voltage on node N1 (e.g., 0 volts). In this instance, Vout generated by sense amplifier 202 will be low (e.g., VSS), thereby turning off transistor MN3 and preventing node N1 from being pulled down to VSS. For at least a portion of each cycle of the clock signal CLK1, transistor MN1 will be turned on, thereby connecting node N1 to VDD and charging node N1. With the pull-down path (through transistors MN2 and MN3) for node N1 disabled, node N1 will begin to accumulate voltage resulting from the periodic activation of the pull-up path through transistor MN1. The voltage on node N1 will essentially only be discharged as a result a leakage current path to VSS (e.g., through capacitor C1, or transistors MN2 and MN3).

As the voltage level on node N1 rises above the reference voltage level Vref (e.g., about 0.4 volts for a 28-nm process), the output Vout of sense amplifier 202 will switch from low to high (e.g., VDD), thereby turning on transistor MN3. With transistor MN3 turned on, node N1 will be pulled down to VSS through transistor MN2 as a function of clock signal CLK2. If transistor MN2 is configured to be stronger than transistor MN1 (e.g., transistor MN2 is preferably sized larger than transistor MN1), the voltage on node N1 will continue to discharge until node N1 falls below Vref, at which point the output of sense amplifier 202 will again switch from high to low, thereby disabling transistor MN3 and the corresponding primary discharge current path to VSS. In this manner, DSM 200 generates a digital output stream Vout for maintaining the voltage on node N1 to within a prescribed range of the reference voltage level Vref.

Figure 3:
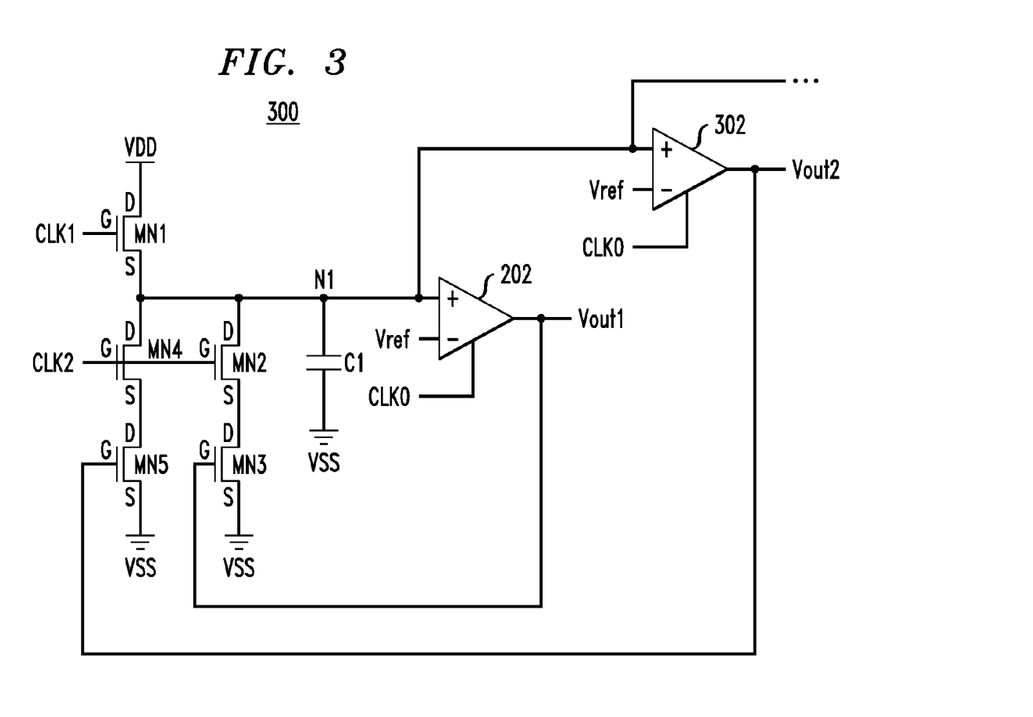
FIG. 3 is a schematic diagram depicting at least a portion of an exemplary multiple-bit first order delta-sigma modulator, according to an embodiment of the present invention.

In accordance with aspects of the present invention, principles described herein may be extended to effectively form a multiple-bit DSM. By way of example only and without loss of generality, FIG. 3 is a schematic diagram depicting at least a portion of an exemplary first-order multiple-bit DSM 300, according to an embodiment of the invention. DSM 300 includes a plurality of individual one-bit DSMs, one or more of which may be formed in a manner consistent with the exemplary DSM 200 shown in FIG. 2, except that certain components in the one-bit DSM are shared with one another, as will be described in further detail below. Each one-bit DSM preferably functions as a local monitor circuit in a distributed IC power supply monitoring network. As apparent from FIG. 3, DSM 300 utilizes a plurality of latching differential sense amplifiers/comparators each connected to a common sampling node and pull-up circuit via a corresponding feedback path. With multiple latching sense amplifiers, each connected to a similarly sized and configured feedback pull-down circuit, noise in the latching sense amplifiers is effectively eliminated or reduced and resolution is increased using decimation or alternative averaging techniques. This allows the multi-bit DSM to deliver a higher-resolution result using the same sample and hold circuit.

The process of decimation is used in a DSM to eliminate redundant data at the output. The Nyquist sampling theorem shows that a band-limited analog signal that has been sampled can be perfectly reconstructed from an infinite sequence of samples if the sampling rate exceeds 2 f samples per second, where f is the highest frequency in the original signal. Thus, the sampling rate only needs to be twice the input signal bandwidth in order to reliably reconstruct the input signal without distortion. However, a DSM typically grossly oversamples the input signal in order to reduce quantization noise (quantization noise is pushed to a higher portion of the frequency spectrum, well above the highest frequency of the input signal, as previously explained). Therefore, there is redundant data that can be eliminated without introducing distortion to the conversion result. The decimation process simply reduces the output sample rate while retaining the necessary information.

More particularly, DSM 300 comprises a pull-up/voltage scaling circuit coupled between a voltage supply source, which may be VDD, and a common sampling node N1 of the DSM. In the embodiment shown, the pull-up circuit comprises a first NMOS transistor MN1 having a drain adapted for connection to VDD, a gate for receiving a first clock signal, CLK1, and a source connected to the sampling node N1. It is to be appreciated, however, that the invention is not limited to the specific circuit arrangement shown. For example, the pull-up circuit may comprise a PMOS transistor device (not explicitly shown) either in place of or in parallel with transistor MN1. DSM 300 includes a capacitor C1 having a first terminal connected to node N1 and a second terminal adapted for connection to a voltage source, which may be VSS. The pull-up circuit, sampling node Ni and capacitor C1 are all preferably shared by each of the plurality of one-bit DSMs in the multiple-bit DSM 300.

DSM 300 further comprises first and second one-bit DSMs. The first one-bit DSM comprises a first latching differential sense amplifier/comparator 202 having a first input, which may be a non-inverting (+) input, connected to node N1, a second input, which may be an inverting (−) input, for receiving a reference voltage, Vref, a control input for receiving a sampling clock, CLK0, and an output for generating a first digital output signal, Vout1. The first digital output signal Vout1 is fed back to the sampling node N1 via a corresponding first pull-down circuit comprising a second NMOS transistor MN2 and a third NMOS transistor MN3 connected together in series between node N1 and a voltage return of the DSM 300, which may be VSS. Specifically, a drain of transistor MN2 is connected to node N1, a gate of MN2 is adapted to receive a second clock signal, CLK2, a source of MN2 is connected to a drain of transistor MN3, a gate of MN3 is connected to the output of the first latching sense amplifier 202 and is adapted to receive the first output signal Vout1, and a source of MN3 is adapted for connection to VSS.

Likewise, the second one-bit DSM comprises a second latching differential sense amplifier/comparator 302 having a first input, which may be a non-inverting (+) input, connected to common sampling node N1, a second input, which may be an inverting (−) input, for receiving the reference voltage Vref, a control input for receiving the sampling clock CLK0, and an output for generating a second digital output signal, Vout2. The second digital output signal Vout2 is fed back to the sampling node N1 via a corresponding second pull-down circuit comprising a fourth NMOS transistor MN4 and a fifth NMOS transistor MN5 connected together in series between node N1 and VSS. Specifically, a drain of transistor MN4 is connected to node N1, a gate of MN4 is adapted to receive the second clock signal CLK2, a source of MN4 is connected to a drain of transistor MN5, a gate of MN5 is connected to the output of the second latching sense amplifier 302 and is adapted to receive the second output signal Vout2, and a source of MN5 is adapted for connection to VSS. It is to be understood, however, that the invention is not limited to the specific circuit implementation shown. For example, additional one-bit DSMs can be included in DSM 300, each one-bit DSM comprising a latching differential sense amplifier and corresponding pull-down circuitry (not explicitly shown), to effectively form a DSM with higher resolution. There is no specific limit to the number of one-bit DSMs that can be included in DSM 300.

Each of the individual one-bit DSMs in DSM 300 preferably functions in a manner consistent with DSM 200 described above and illustrated in FIG. 2. By utilizing a common sampling node N1 and pull-up circuit for the plurality of one-bit DSMs, non-systematic noise attributable to the latching comparators can be averaged and effectively eliminated or at least significantly reduced. In simulation results, a DSM comprised of four individual one-bit DSMs connected in the manner described appears to have a similar accuracy to a single-bit modulator with half the deadband in the latching sense amplifier.

Figure 4:
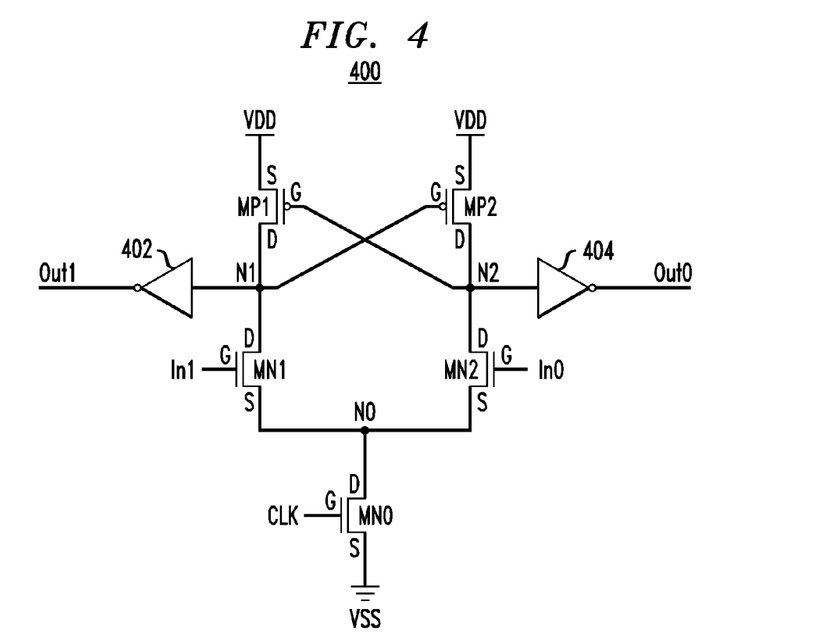
FIG. 4 is a schematic diagram depicting at least a portion of an exemplary latching differential sense amplifier/comparator for use in the modulator shown in FIGS. 2 and 3, according to an embodiment of the present invention.

FIG. 4 is a schematic diagram depicting at least a portion of an exemplary latching differential sense amplifier/comparator 400 suitable for use in the illustrative modulators 200 and 300 shown in FIGS. 2 and 3, respectively, according to an embodiment of the present invention. Sense amplifier 400 comprises a differential input stage including a first NMOS transistor MN1 and a second NMOS transistor MN2. Sources of transistors MN1 and MN2 are connected together at a common tail node N0, a gate of MN2 forms a first input of the sense amplifier and is adapted to receive a first input signal, In0, and a gate of MN1 forms a second input of the sense amplifier and is adapted to receive a second input signal, In1. The sense amplifier 400 is biased using a bias circuit comprising NMOS transistor MN0 having a source adapted for connection to a voltage return of the sense amplifier, which may be VSS, a drain connected to node N0, and a gate adapted to receive a bias signal, in this case, clock signal CLK. Thus, when CLK is high (e.g., VDD or about 0.85 volts), transistor MN0 will be turned on, thereby connecting node N0 to VSS. When CLK is low (e.g., zero volts), transistor MN0 will be turned off, thereby disabling sense amplifier 400.

Sense amplifier 400 further includes a load stage coupled to the differential input stage. The load stage comprises a first PMOS transistor MP1 and a second PMOS transistor MP2 connected together in a cross-coupled configuration to form a latch. Specifically, a drain of transistor MP1 is connected to a drain of transistor MN1 at node N1, a drain of transistor MP2 is connected to a drain of transistor MN2 at node N2, sources of MP1 and MP2 are adapted for connection to a voltage supply of sense amplifier 400, which may be VDD, a gate of MP1 is connected to node N2, and a gate of MP2 is connected to node N1. Nodes N1 and N2 form output nodes of sense amplifier 400. Each of these output nodes N1 and N2 is preferably buffered to reduce the likelihood that a circuit to which the sense amplifier is connected will undesirably influence the output signals generated at these nodes (e.g., due to loading effects, noise, etc.).

More particularly, sense amplifier 400 includes a first buffer circuit comprising a first inverter 402 having an input connected to node N1 and an output adapted to generate a first output signal, Out1, and a second buffer circuit comprising a second inverter 404 having an input connected to node N2 and an output adapted to generate a second output signal, Out0. Signals Out0 and Out1 are buffered differential output signals which are indicative of the output signals generated at nodes N2 and N1, respectively. Although inverting buffer circuits are used in sense amplifier 400, the invention similarly contemplates other buffer circuit arrangements, including, e.g., non-inverting buffer circuits.

According to another aspect of the invention, one or more one-bit DSMs in a distributed IC power supply monitoring network may be selectively enabled or disabled so as to form a monitoring network having a programmable resolution. A separate control signal (or signals) can be utilized to individually select which one-bit DSMs to enable. In this manner, when high accuracy is required (e.g., in a debugging application), all (or a larger number) of the one-bit DSMs in the monitoring network can be enabled (i.e., activated), but when high accuracy is not required in a given application, one or more local one-bit DSMs can be disabled to beneficially conserve power in the IC.

In accordance with other aspects of the invention, the IC power supply monitoring network can be advantageously utilized in conjunction with suitable control circuitry, to selectively modify one or more parameters of the IC (e.g., supply voltage, clock frequency (i.e., speed), timing, data flow, etc.) as a function of prescribed conditions measured by the power supply monitoring network. For example, the IC power supply monitoring network can be adapted to provide an output signal indicative of a low voltage supply condition in at least a portion of the IC. A controller, or alternative control circuitry, can then utilize this information to increase the voltage level in at least the portion of the IC in which the voltage supply is identified as being below a prescribed threshold level. Likewise, the controller may be operative to increase or decrease clock speed, or modify alternative timing parameters, as a function of one or more monitored conditions in the IC to thereby advantageously optimize power consumption, performance, etc. in the IC.

Figure 5:
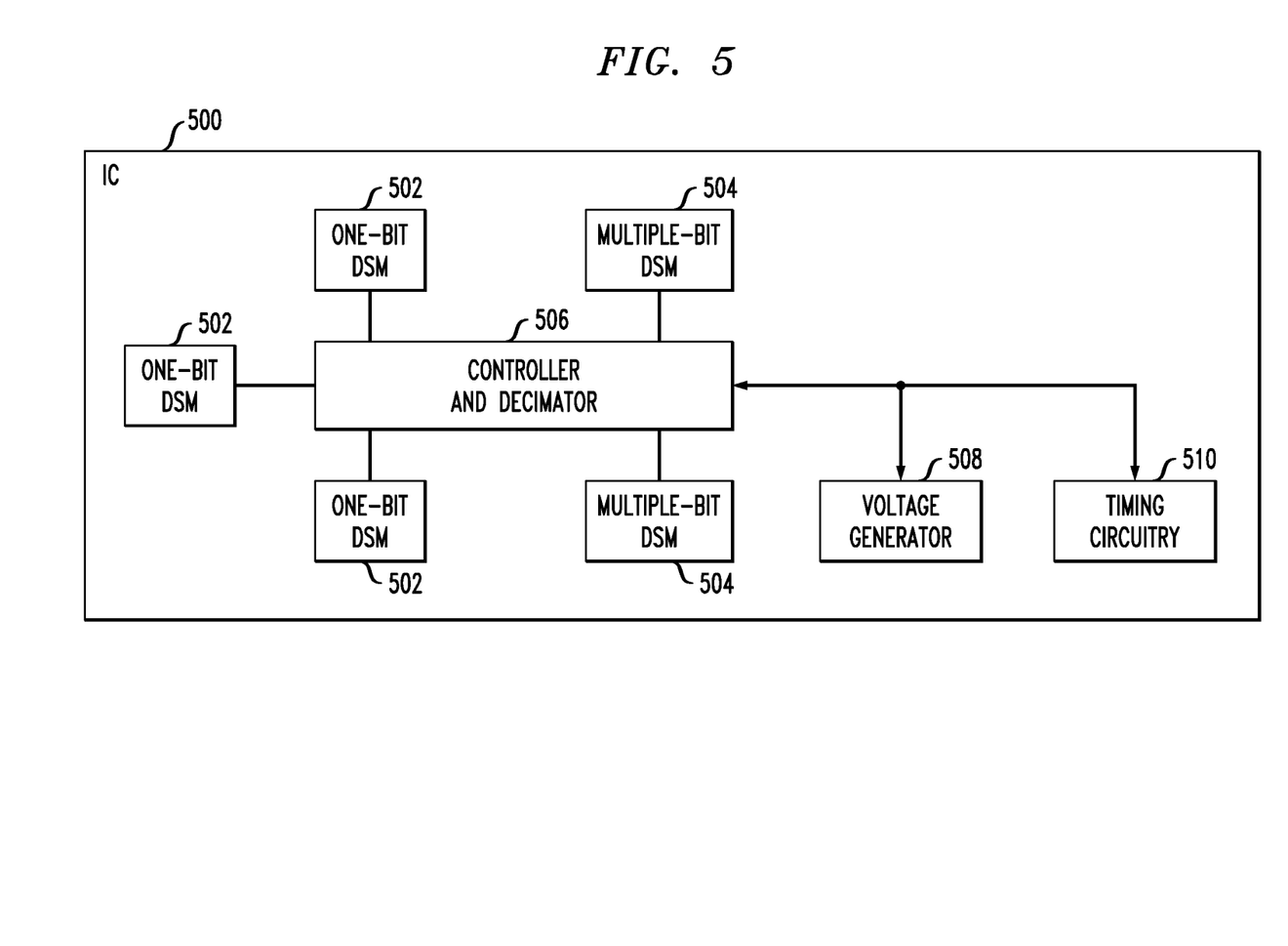
FIG. 5 is a block diagram depicting at least a portion of an exemplary IC including a distributed IC power supply monitoring network, according to an embodiment of the invention.

FIG. 5 is a block diagram depicting at least a portion of an exemplary IC 500 including a distributed IC power supply monitoring network according to an embodiment of the invention. The IC power supply monitoring network may be formed in a manner consistent with the teachings herein (see, e.g., FIGS. 1 through 4). Specifically, IC 500 includes one or more local one-bit DSMs 502, for example DSM 200 described above in connection with FIG. 2, and/or one or more multiple-bit DSMs 504, for example DSM 300 described above in connection with FIG. 3, operatively coupled to a common controller 506, or alternative control circuitry. Controller 506 may also include a decimator, or alternative decimation circuitry, operative to increase the accuracy of the IC power supply monitoring network. Information received by controller 506 from the plurality of DSM's 502 and 504 can be used by the controller to modify one or more operating characteristics of the IC, including, for example, a voltage generator 508 (which may be used to control the voltage supply of the IC and/or other voltage sources used in the IC) and/or timing circuitry 510 in the IC.

Controller 506 may include a processor and memory coupled to the processor, the processor being configured to perform at least a portion of the methodologies of the present invention, an illustrative embodiment of which is shown in FIG. 5 and described above. Controller 506 may include input/output (I/O) circuitry for interfacing with the processor. It is to be appreciated that the term "processor" as used herein is intended to include any processing device, such as, for example, one that includes a central processing unit (CPU) and/or other processing circuitry (e.g., network processor, digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor. In any case, it is to be appreciated that at least a portion of the components shown in the previous figures may be implemented in various forms of hardware, software, or combinations thereof (e.g., one or more DSPs with associated memory, application-specific integrated circuit(s), functional circuitry, one or more operatively programmed general purpose digital computers with associated memory, etc). Given the teachings of the invention provided herein, one of ordinary skill in the art will be able to contemplate other implementations of the components of the invention.

At least a portion of the illustrative techniques of the present invention may be implemented in the manufacture of an integrated circuit. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An apparatus for monitoring at least supply voltage in an integrated circuit, comprising:
    a plurality of monitor circuits distributed throughout the integrated circuit, each of the monitor circuits being operative to receive the supply voltage or a signal representative thereof and to generate at least one output signal indicative of a comparison between the supply voltage and a reference voltage; and
    a control circuit coupled to the plurality of monitor circuits, the control circuit being operative to receive the respective output signals from the plurality of monitor circuits and to generate an output of the apparatus which is a function of information conveyed in the respective output signals from the plurality of monitor circuits;
    wherein at least one of the plurality of monitor circuits comprises:
    an integration circuit;
    a latching sense amplifier, the latching sense amplifier including a first input connected to the integration circuit, a second input adapted to receive the reference voltage, a control input adapted to receive a control signal supplied to the sense amplifier, and an output for generating the output signal indicative of a comparison between the supply voltage and the reference voltage as a function of the control signal; and
    a pull-down circuit coupled to the integration circuit in a feedback configuration, the pull-down circuit being operative to receive the output signal generated by the latching sense amplifier and to provide a current discharge path for controlling a voltage at a common summing node in the integration circuit.

2. The apparatus of claim 1, wherein the integration circuit comprises:
    a pull-up circuit adapted for connection to the supply voltage; and
    a capacitive element coupled to the pull-up circuit, the capacitive element being operative to accumulate a voltage for comparison with the reference voltage as a function of at least first and second clock signals supplied to the apparatus.

3. The apparatus of claim 2, wherein the control signal supplied to the sense amplifier is a logical complement of the first and second clock signals.

4. The apparatus of claim 2, wherein a duty cycle of at least one of the first and second clock signals is selectively controlled such that the respective pull-up and pull-down circuits have a substantially same effective resistance relative to one another.

5. The apparatus of claim 2, wherein a strength of the pull-down circuit is adapted to be greater than a strength of the pull-up circuit.

6. The apparatus of claim 1, wherein the at least one of the plurality of monitor circuits comprises:
    a plurality of latching sense amplifiers, each of the latching sense amplifiers including a first input connected to the integration circuit, a second input adapted to receive the reference voltage, a control input adapted to receive a control signal supplied to the sense amplifier, and an output for generating an output signal indicative of a comparison between the supply voltage and the reference voltage as a function of the control signal; and
    a plurality of pull-down circuits coupled to the integration circuit in a feedback configuration, each of the respective pull-down circuits being operative to receive the output signal generated by a corresponding one of the latching sense amplifiers and to provide a corresponding current discharge path for controlling a voltage at a common summing node in the integration circuit.

7. The apparatus of claim 6, wherein the integration circuit comprises:
    a pull-up circuit adapted for connection to the supply voltage; and
    a capacitive element coupled to the pull-up circuit, the capacitive element being operative to accumulate a voltage for comparison with the reference voltage as a function of at least first and second clock signals supplied to the apparatus.

8. The apparatus of claim 7, wherein the control signal supplied to the plurality of sense amplifiers is a logical complement of the first and second clock signals.

9. The apparatus of claim 7, wherein a duty cycle of at least one of the first and second clock signals is selectively controlled such that the respective pull-up and pull-down circuits have a substantially same effective resistance relative to one another.

10. The apparatus of claim 7, wherein a strength of each of the respective pull-down circuits is adapted to be greater than a strength of the pull-up circuit.

11. The apparatus of claim 1, wherein each of the plurality of monitor circuits comprises a one-bit delta-sigma modulator.

12. The apparatus of claim 1, wherein each of the plurality of monitor circuits comprises a multiple-bit delta-sigma modulator.

13. The apparatus of claim 1, wherein each of the plurality of monitor circuits comprises one of a one-bit delta-sigma modulator and a multiple-bit delta-sigma modulator.

14. The apparatus of claim 1, wherein the control circuit is further operative to modify at least one operating characteristic of the integrated circuit as a function of the information conveyed in the respective output signals from the plurality of monitor circuits.

15. The apparatus of claim 14, wherein the at least one operating characteristic of the integrated circuit comprises at least one of the supply voltage, clock frequency, timing and data flow of the integrated circuit.

16. An apparatus for monitoring at least supply voltage in an integrated circuit, comprising:
a plurality of monitor circuits distributed throughout the integrated circuit, each of the monitor circuits being operative to receive the supply voltage or a signal representative thereof and to generate at least one output signal indicative of a comparison between the supply voltage and a reference voltage; and
a control circuit coupled to the plurality of monitor circuits, the control circuit being operative to receive the respective output signals from the plurality of monitor circuits and to generate an output of the apparatus which is a function of information conveyed in the respective output signals from the plurality of monitor circuits;
wherein the control circuit comprises a decimation circuit operative to average at least a subset of the plurality of respective output signals generated by the plurality of monitor circuits to thereby increase a resolution of the output of the apparatus.

17. An apparatus for monitoring at least supply voltage in an integrated circuit, comprising:
a plurality of monitor circuits distributed throughout the integrated circuit, each of the monitor circuits being operative to receive the supply voltage or a signal representative thereof and to generate at least one output signal indicative of a comparison between the supply voltage and a reference voltage; and
a control circuit coupled to the plurality of monitor circuits, the control circuit being operative to receive the respective output signals from the plurality of monitor circuits and to generate an output of the apparatus which is a function of information conveyed in the respective output signals from the plurality of monitor circuits;
wherein the control circuit is further operative to selectively enable or disable at least a subset of the plurality of monitor circuits to thereby form a monitoring network having a programmable resolution.

18. An integrated circuit, comprising:
at least one power supply monitoring network operative to monitor a supply voltage of the integrated circuit, the at least one power supply monitoring network comprising:
a plurality of monitor circuits distributed throughout the integrated circuit, each of the monitor circuits being operative to receive the supply voltage or a signal representative thereof and to generate at least one output signal indicative of a comparison between the supply voltage and a reference voltage; and
a control circuit coupled to the plurality of monitor circuits, the control circuit being operative to receive the respective output signals from the plurality of monitor circuits and to generate an output of the power supply monitoring network which is a function of information conveyed in the respective output signals from the plurality of monitor circuits;
wherein at least one of the plurality of monitor circuits comprises:
an integration circuit;
a latching sense amplifier, the latching sense amplifier including a first input connected to the integration circuit, a second input adapted to receive the reference voltage, a control input adapted to receive a control signal supplied to the sense amplifier, and an output for generating the output signal indicative of a comparison between the supply voltage and the reference voltage as a function of the control signal; and
a pull-down circuit coupled to the integration circuit in a feedback configuration, the pull-down circuit being operative to receive the output signal generated by the latching sense amplifier and to provide a current discharge path for controlling a voltage at a common summing node in the integration circuit.

19. The integrated circuit of claim 18, wherein the integration circuit comprises:
a pull-up circuit adapted for connection to the supply voltage; and
a capacitive element coupled to the pull-up circuit, the capacitive element being operative to accumulate a voltage for comparison with the reference voltage as a function of at least first and second clock signals supplied to the power supply monitoring network.

20. The integrated circuit of claim 18, wherein the at least one of the plurality of monitor circuits comprises:
a plurality of latching sense amplifiers, each of the latching sense amplifiers including a first input connected to the integration circuit, a second input adapted to receive the reference voltage, a control input adapted to receive a control signal supplied to the sense amplifier, and an output for generating an output signal indicative of a comparison between the supply voltage and the reference voltage as a function of the control signal; and
a plurality of pull-down circuits coupled to the integration circuit in a feedback configuration, each of the respective pull-down circuits being operative to receive the output signal generated by a corresponding one of the latching sense amplifiers and to provide a corresponding current discharge path for controlling a voltage at a common summing node in the integration circuit.

21. The integrated circuit of claim 20, wherein the integration circuit comprises:
a pull-up circuit adapted for connection to the supply voltage; and
a capacitive element coupled to the pull-up circuit, the capacitive element being operative to accumulate a voltage for comparison with the reference voltage as a function of at least first and second clock signals supplied to the power supply monitoring network.

22. An electronic system, comprising:
an integrated circuit including at least one power supply monitoring network operative to monitor a supply voltage of the integrated circuit, the at least one power supply monitoring network comprising:
a plurality of monitor circuits distributed throughout the integrated circuit, each of the monitor circuits being operative to receive the supply voltage or a signal representative thereof and to generate at least one output signal indicative of a comparison between the supply voltage and a reference voltage; and
a control circuit coupled to the plurality of monitor circuits, the control circuit being operative to receive the respective output signals from the plurality of monitor circuits and to generate an output of the power supply monitoring network which is a function of information conveyed in the respective output signals from the plurality of monitor circuits;

wherein at least one of the plurality of monitor circuits comprises:

an integration circuit;

a latching sense amplifier, the latching sense amplifier including a first input connected to the integration circuit, a second input adapted to receive the reference voltage, a control input adapted to receive a control signal supplied to the sense amplifier, and an output for generating the output signal indicative of a comparison between the supply voltage and the reference voltage as a function of the control signal; and a pull-down circuit coupled to the integration circuit in a feedback configuration, the pull-down circuit being operative to receive the output signal generated by the latching sense amplifier and to provide a current discharge path for controlling a voltage at a common summing node in the integration circuit.

23. A method for monitoring at least supply voltage in an integrated circuit including a plurality of monitor circuits distributed throughout the integrated circuit and a control circuit coupled to the plurality of monitor circuits, the method comprising the steps of:

each of the monitor circuits receiving the supply voltage or a signal representative thereof and generating at least one output signal indicative of a comparison between the supply voltage and a reference voltage;

the control circuit receiving the respective output signals from the plurality of monitor circuits and generating an output which is a function of information conveyed in the respective output signals from the plurality of monitor circuits; and decimating at least a subset of the plurality of respective output signals generated by the plurality of monitor circuits, thereby increasing a resolution of the output of the control circuit.

24. The method of claim 23, further comprising controlling at least one operating characteristic of the integrated circuit as a function of the information conveyed in the respective output signals from the plurality of monitor circuits.

25. A method for monitoring at least supply voltage in an integrated circuit including a plurality of monitor circuits distributed throughout the integrated circuit and a control circuit coupled to the plurality of monitor circuits, the method comprising the steps of:

each of the monitor circuits receiving the supply voltage or a signal representative thereof and generating at least one output signal indicative of a comparison between the supply voltage and a reference voltage;

the control circuit receiving the respective output signals from the plurality of monitor circuits and generating an output which is a function of information conveyed in the respective output signals from the plurality of monitor circuits;

accumulating a voltage indicative of supply voltage on a capacitive element included in at least one of the plurality of monitor circuits;

comparing the voltage accumulated on the capacitive element with a reference voltage; and the at least one of the plurality of monitor circuits generating the output signal as a function of a difference between the voltage accumulated on the capacitive element and the reference voltage and on at least first and second clock signals supplied to the at least one of the plurality of monitor circuits.

* * * * *